(12) United States Patent
Ardehali (10) Patent No.: US 8,975,977 B2
(45) Date of Patent: Mar. 10, 2015

(54) LOW NOISE AND LOW POWER VOLTAGE CONTROLLED OSCILLATORS

(76) Inventor: Mohammad Ardehali, Palo Alto, CA (US)

( * ) Notice: Subject to any disclaimer, the term of this patent is extended or adjusted under 35 U.S.C. 154(b) by 143 days.

(21) Appl. No.: 13/466,830

(22) Filed: May 8, 2012

(65) Prior Publication Data

US 2013/0300476 A1   Nov. 14, 2013

(51) Int. Cl.
*H03L 7/099*   (2006.01)

(52) U.S. Cl.
USPC .... 331/185; 331/57; 331/117 R; 331/117 FE; 331/117 D; 331/167; 331/186

(58) Field of Classification Search
USPC ...... 331/57, 117 R, 117 FE, 117 D, 167, 185, 331/186
See application file for complete search history.

(56) References Cited

U.S. PATENT DOCUMENTS

| | | | | |
|---|---|---|---|---|
| 4,327,321 | A  * | 4/1982 | Suzuki et al. | 323/315 |
| 5,635,878 | A  * | 6/1997 | Liu et al. | 331/57 |
| 5,784,072 | A  * | 7/1998 | Imamura et al. | 345/567 |
| 6,060,918 | A  * | 5/2000 | Tsuchida et al. | 327/143 |
| 6,633,202 | B2 * | 10/2003 | Yang et al. | 331/57 |
| 7,019,598 | B2 * | 3/2006 | Duncan et al. | 331/176 |
| 7,372,316 | B2 * | 5/2008 | Chatterjee et al. | 327/513 |
| 7,432,763 | B2 * | 10/2008 | Leete | 330/254 |
| 7,639,093 | B2 * | 12/2009 | Ardehali | 331/57 |
| 2006/0145744 | A1 * | 7/2006 | Diorio et al. | 327/276 |
| 2007/0132522 | A1 * | 6/2007 | Lee et al. | 331/167 |
| 2008/0284529 | A1 * | 11/2008 | Refeld et al. | 331/57 |

\* cited by examiner

*Primary Examiner* — Arnold Kinkead
*Assistant Examiner* — Richard Tan
(74) *Attorney, Agent, or Firm* — TIPS Group (57) ABSTRACT

LC tank and ring-based VCOs are disclosed that each include a differential pair of transistors for steering a tail current generated by a current source responsive to a bias voltage. A biasing circuit generates the bias voltage such that a transconductance for the transistors in the differential pairs is inversely proportional to a resistance.

8 Claims, 7 Drawing Sheets

LOW NOISE AND LOW POWER VOLTAGE CONTROLLED OSCILLATORS

TECHNICAL FIELD

The present invention relates generally to voltage controlled oscillators and more particularly to a voltage controlled oscillator having an amplitude and frequency that is independent of process variations and temperature.

BACKGROUND

Voltage controlled oscillators (VCOs) are an important and integral part of many electronics systems. VCO applications include carrier synthesis in cellular phones, phase locked loops in microprocessors and communication systems, and clock generations for optical communications. Although VCOs are thus ubiquitous, they are also some of the most power hungry and also noisy components in electrical systems. The development of low noise and low power LC tank VCO designs and also ring-based VCO designs continues to be challenging.

Accordingly, there is a need in the art for improved VCO architectures that offer improved low noise and low power consumption properties.

SUMMARY

In one embodiment, an LC tank voltage controlled oscillator (VCO) is disclosed having an output signal having a frequency responsive to a tuning signal. The LC tank VCO includes: a first inductor and a second inductor, each inductor having a parallel equivalent resistance; a differential pair of transistors configured to steer a tail current from a current source transistor, a first transistor in the differential pair coupled to a power supply node through the first inductor and a second transistor in the differential pair coupled to the power supply node through the second inductor; and a biasing circuit configured to generate a bias voltage for the current source transistor such that a transconductance for the first and second transistors is proportional to the inverse of the parallel equivalent resistance.

In another embodiment, a ring-based voltage-controlled oscillator (VCO) is provided that includes: a plurality of differential inverters coupled to form a loop, each differential inverter having a differential pair of transistors configured to steer a tail current from a current source transistor, the current source transistor sourcing the tail current responsive to a bias voltage, wherein a first transistor in the differential pair couples to a power source through a first voltage-controlled resistor and a second transistor in the differential pair couples to the power source through a second voltage-controlled resistor; and a biasing circuit configured to generate the bias voltage such that a transconductance for each of the transistors in the differential pair is inversely proportional to a resistance for each of the voltage-controlled resistors.

The invention will be more fully understood upon consideration of the following detailed description, taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Low noise and low power designs are disclosed herein for both LC tank VCOs as well as ring-based VCOs. The LC tank innovation will be addressed first LC Tank VCO In recent years monolithic inductors have appeared in CMOS and bipolar technologies, which made it possible to design integrated oscillators using an LC resonant circuit. A resonant "tank" is formed when an inductor L is placed in parallel with a capacitor C. The energy resonates within the tank at a frequency of $\omega_{res}$ given by the following expression:

$$\omega_{res} = \frac{1}{\sqrt{LC}}.$$

Figure 1A:
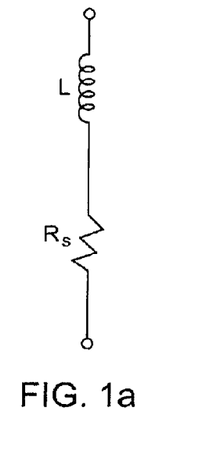
FIG. 1a shows an equivalent circuit for an inductor with a series resistance.
Figure 1B:
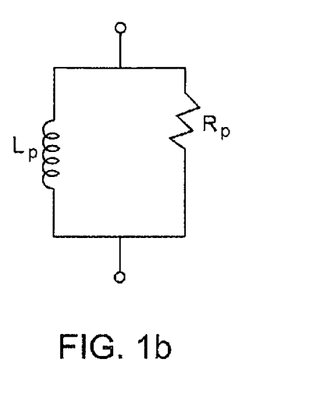
FIG. 1b shows an equivalent circuit for an inductor with a parallel resistance.

At this resonant frequency the impedances of the capacitor and the inductor are equal and opposite, thereby giving an infinite impedance. However, in a real-world resonant tank, the inductors suffer from a series resistive component as shown by the equivalent circuit of FIG. 1(a). The series resistance of FIG. 1(a) can be transformed into an equivalent parallel resistance of FIG. 1(b), which lends itself to easier analysis and design. The equivalent circuit of FIG. 1(b) has the same reactance but has a resistance $R_p$ that is $Q^2$ times the series resistance $R_s$, where Q is the quality factor for the inductor. Both Q and the series resistance $R_s$ have been measured and simulated extensively for integrated circuit inductors. Thus, the parallel resistance $R_p$ for such inductors at the frequencies of interest is known to an accurate approximation. The parallel inductance $L_p$ may be considered to be equal to the inductance L.

Figure 2:
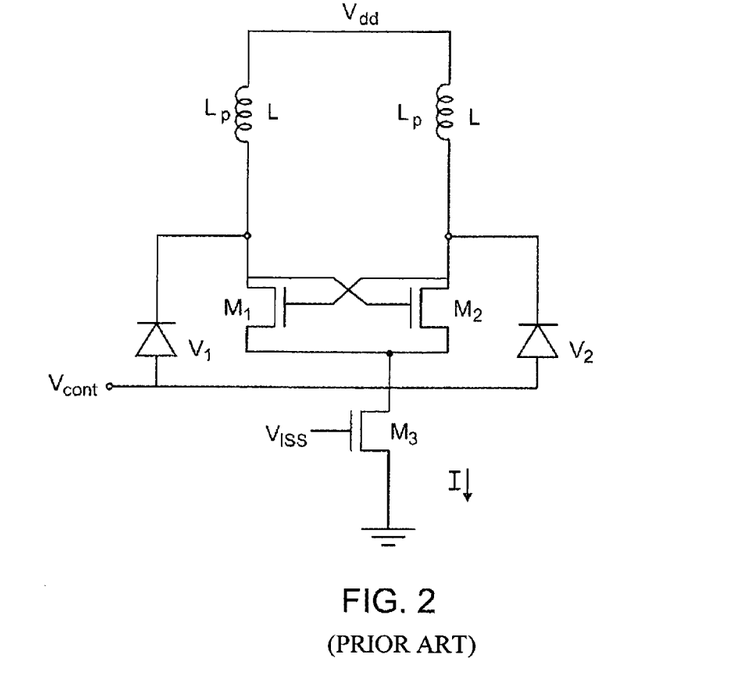
FIG. 2 is a circuit diagram for a conventional LC tank VCO.

A conventional LC tank VCO is shown in FIG. 2. The parallel resistance for inductors Lp is not shown for illustration clarity. Two "LC tanks" are formed by the combination of the capacitances from a pair of varactors $V_1$ and $V_2$ and the parallel inductance $L_p$ for a pair of inductors L. A differential pair of transistors $M_1$ and $M_2$ have their drains coupled to respective ones of the inductors L. A control voltage $V_{contl}$ controls the capacitance of varactors $V_1$ and $V_2$ so as to control the oscillation frequency. The drain voltage for $M_1$ drives the gate of $M_2$. Similarly, the drain voltage for $M_2$ drives the gate of $M_1$. Thus, as the drain voltage for $M_1$ rises, the drain voltage for $M_2$ falls because $M_2$ is switched on. Similarly, as the drain voltage for $M_2$ rises, the drain voltage for $M_1$ falls because $M_1$ is switched on. In this fashion, a tail current I conducted through a current source transistor $M_3$ is switched between $M_1$ and $M_2$ responsive to oscillation of the LC tank VCO.

The oscillation condition for the LC tank VCO is given by the following expression:

$$(g_{m1,2}R_p)^2 \geq 1,$$

where $g_{m1,2}$ is the transconductance of either $M_1$ and $M_2$ (their transconductances being equal since they are a matched pair). If the startup condition is satisfied, the noise component at the resonant frequency are continually amplified by $M_1$ and $M_2$, thus leading to oscillation. If $(g_{m1,2}R_p)^2 \geq 1$, then the oscillation amplitude grows until the loop gain drops at the peak, limiting the maximum amplitude.

The transconductance of the differential pair $M_1$ and $M_2$ thus plays a key role in determining the startup condition of LC tank voltage controlled oscillators. For any differential pair, the transconductance of $M_1$ and $M_2$ is proportional to that of $M_3$ such that $g_{m1}=g_{m2}=Ag_{m3}$, where A is a proportionality constant and $g_{m3}$ is the transconductance for $M_3$. In particular, if $M_1$, $M_2$ and $M_3$ all have the same widths and lengths, then the currents through $M_1$ and $M_2$ are half the current through $M_3$ (at equilibrium). In such a case, $g_{m1,2}$ equals $g_{m3}/\text{sqrt}(2)$, where sqrt represents the square root function. It follows that if the transconductance of $M_3$ could be made proportional to $1/R_p$, the transconductances of $M_1$ and $M_2$ would also become proportional to $1/R_p$. The start up condition for oscillation would then depend only on the ratio of resistors and hence would become independent of temperature and process.

Figure 3:
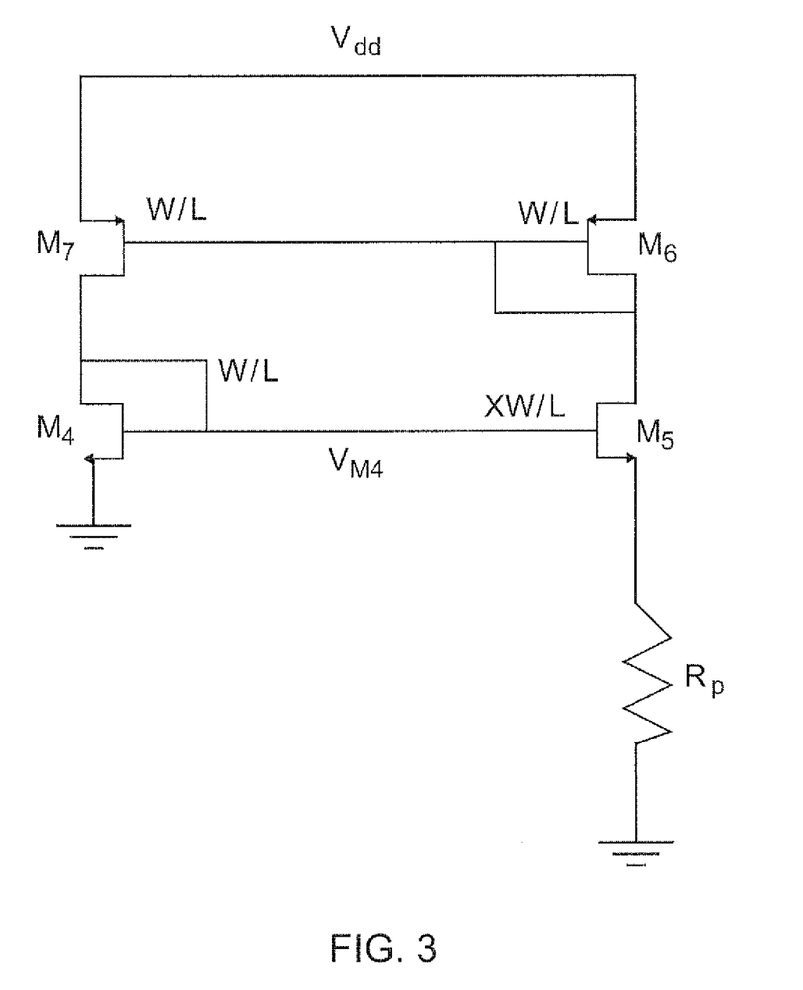
FIG. 3 is a schematic illustration of a biasing circuit.

Turning now to FIG. 3, a supply-independent biasing circuit 300 is shown that achieves this advantageous biasing. Biasing circuit 300 includes a pair of PMOS transistors $M_6$ and $M_7$ in a current mirror relationship such that the drain and gate for transistor $M_6$ as well as the gate for $M_7$ have the same voltage. Since PMOS transistors $M_6$ and $M_7$ form a current mirror, their dimensions as defined through a width (W) and a length (L) ratio W/L are matched. The drain of $M_7$ couples to a drain for an NMOS transistor $M_4$ whose source couples to ground. $M_4$ also has the same W/L ratio. The drain and gate of $M_4$ are coupled together to force $M_4$ into saturation responsive to a gate voltage $V_{M4}$. The drain of $M_6$ couples to a drain of another NMOS transistor $M_5$ whose source couple to ground through a resistance $R_p$. In contrast to the other transistors, $M_5$ has a W/L ratio that is a factor X times larger. But for this size difference, transistors $M_4$ and $M_5$ would also be in a current mirror relationship. It may be shown that the transconductance for $M_4$ (denoted as $g_{m4}$) equals $(2/R_p) \cdot (1-1/\text{sqrt}(X))$. The transconductance for $M_4$ is thus equaling the desired proportionality to a resistance as discussed above with regard to current source transistor $M_3$. Thus, if the dimensions for $M_3$ are made to match those for $M_4$ (same W/L ratio) and if $M_3$ has the same biasing voltage (setting $V_{ISS}$ of FIG. 2 equal to $V_{M4}$ of FIG. 2), then the transconductance $g_{m3}$ also equals $(2/R_p) \cdot (1-1/\text{sqrt}(X))$. As discussed previously, the transconductance $g_{m1,2}$ equals $A \cdot g_{m3}$. It can be seen that X must be larger than one or the transconductance become zero. For example, X can equal ten or any other suitable value larger than one.

Figure 4:
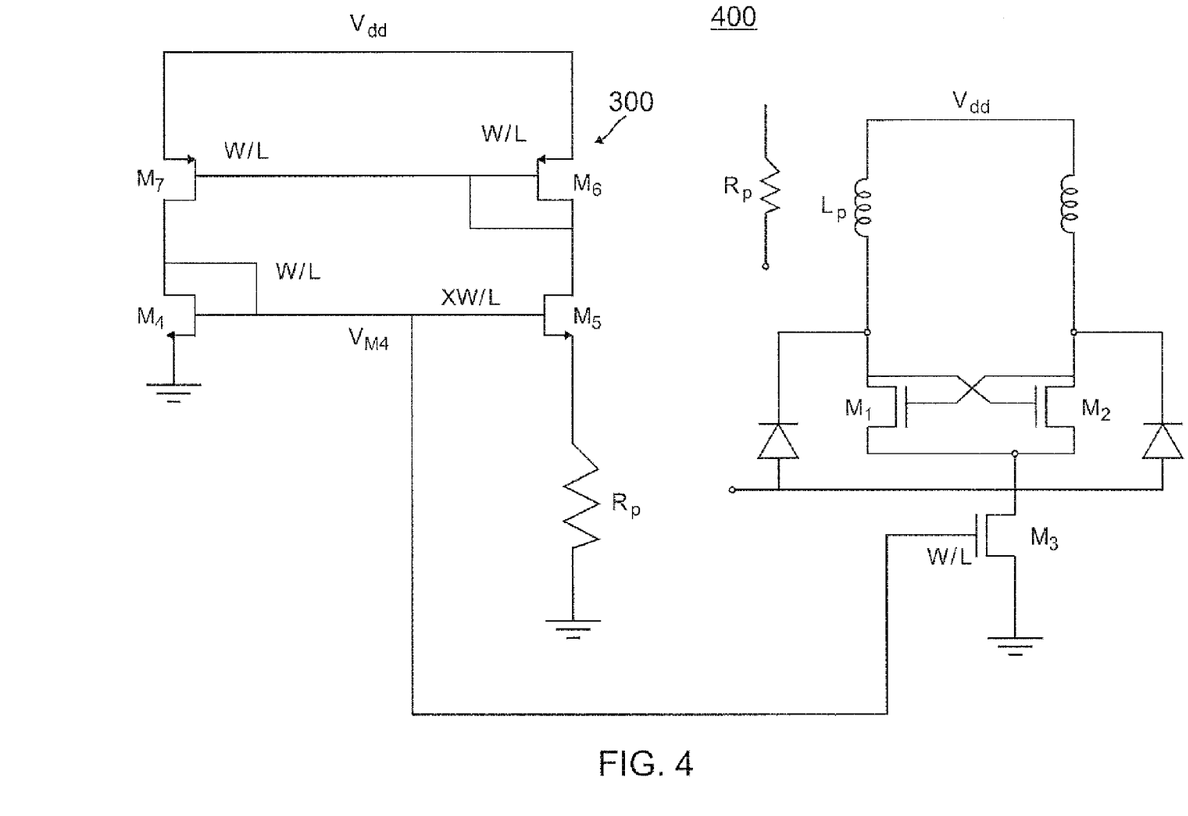
FIG. 4 is a schematic illustration of an LC tank VCO including the biasing circuit of FIG. 3.

The startup condition of $g_{m1,2} \cdot R_p \geq 1$ thus becomes $2A(1-1/\text{sqrt}(X)) \geq 1$. Such a startup condition depends only on the ratio of device widths, which is plainly independent of process corners, temperature, and supply voltage variations. FIG. 4 shows an LC tank VCO 400 that incorporates biasing circuit 300. The gate voltage $V_{M4}$ is also the gate voltage for $M_3$, which is matched to $M_4$. In contrast, the bias voltage $V_{ISS}$ shown for the conventional LC tank VCO of FIG. 2 is typically generated by a bandgap reference so as to achieve oscillation assuming a worst-case transconductance $g_{m1,2}$. Such a worst-case biasing voltage wastes energy in that the tail current I is made larger than it needs to be should the transconductance gm1,2 be more optimal than the worst case that must be designed for. In contrast, VCO 400 is self-compensating and thus achieves low power operation.

VCO 400 also achieves low phase noise as well. In general, VCOs experience amplitude limiting and hence nonlinearity. This effect arises when odd-order nonlinearity in the amplitude leads to intermodulation between an injected noise component and the carrier. In order to account for the effect of noise due to real world nonlinearity, the well-known Leeson's equation for determining phase noise should be multiplied by a factor α, where $\alpha=g_{m1,2}R_p$ is the actual small signal gain.

To ensure that oscillation starts, VCOs based on prior art technologies set $\alpha=g_{m1,2}R_p \geq 1$ for the worst case (usually hot and slow process corners). However, the value of a can be significantly larger for other corners compared to the worst case. Moreover, the magnitude of variations of $R_p$ across process and temperature is not necessarily as much or in the same direction as the magnitude of variations of $g_{m1,2}$). Therefore the phase noise of LC tank VCOs based on prior art technologies varies across process corners, temperatures, and supply voltage. In contrast, the value of a disclosed herein is self-compensating and constant. Hence the phase noise of LC tank VCOs as disclosed herein is the same across all process corners, temperatures and supply voltages.

Ring-Based VCOs

Figure 5:
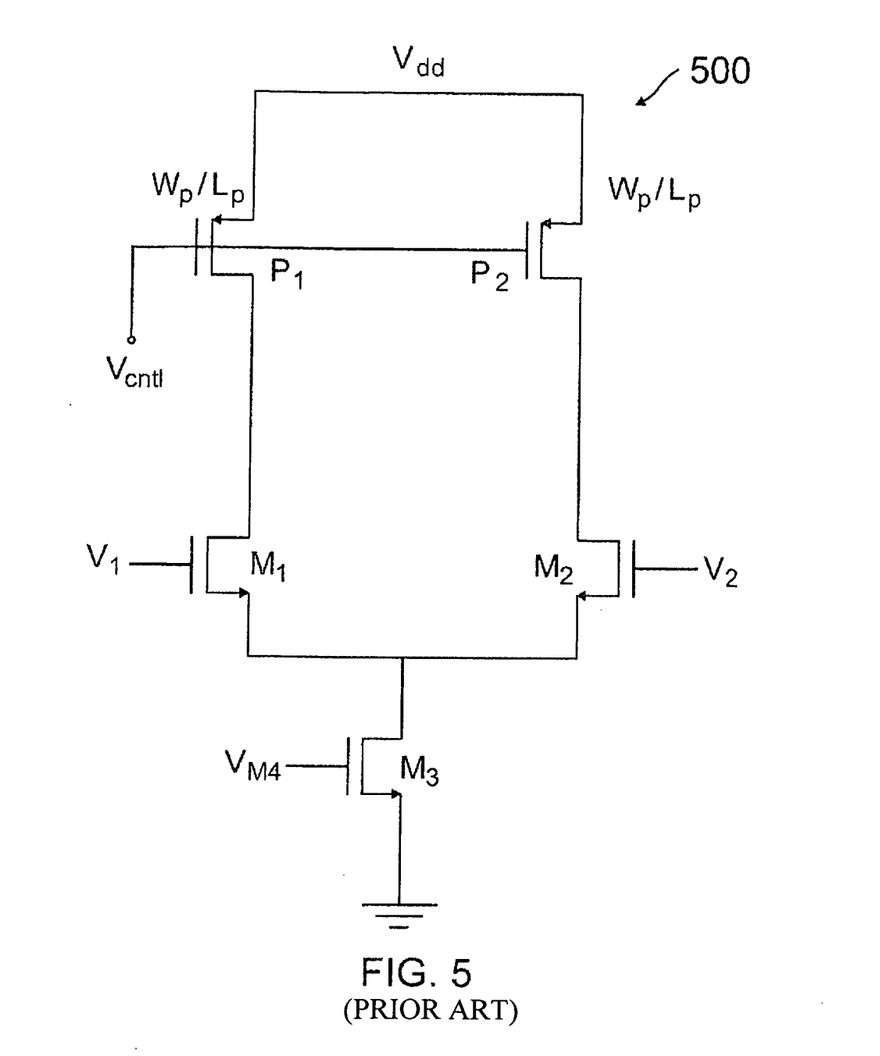
FIG. 5 is a schematic illustration of a conventional ring-based VCO inverter stage.

FIG. 5 shows a stage 500 of a ring-based VCO. Pfets $P_1$ and $P_2$ with threshold voltage of $V_{th,P}$ operate in the triode region, each acting as a variable resistor controlled by $V_{cntl}$. The on-resistance of $P_1$ and $P_2$ operating in deep triode is given by $$R_{onP1,P2}=1/(\mu_p(W/L)C_{ox}[V_{DD}-V_{cntl}-|V_{th,p}|]^2)$$

where $\mu_p$ is the hole mobility, W/L is the width to length ratio, and $V_{th,p}$ is the threshold voltage for $P_1$ and $P_2$. PFETS $P_1$ and $P_2$ thus act as voltage-controlled resistors. As $V_{cntl}$ becomes more positive, the on-resistance of triode FETS $P_1$ and $P_2$ increases, thus increasing the time constant τ, which equals $C_L$ times $R_{onP1,P2}$, where $C_L$ is the total capacitance from the output to ground. The oscillation frequency $f_{osc}$ is inversely proportional to the delay of the circuit, i.e., to τ. Thus the oscillation frequency can be controlled by varying $V_{cntl}$ and is linearly proportional to this control voltage.

In stage 500, a differential pair of transistors NMOS transistors $M_1$ and $M_2$ steer a tail current sourced by a current source NMOS transistor $M_3$ analogously as discussed with regard to the LC tank VCO of FIG. 2. The drain of $M_1$ couples to the drain of $P_1$. Similarly, the drain of $M_2$ couples to the drain of $P_2$. The startup condition is given by Equation (2) discussed above. Thus, if the transconductance of $M_1$ and $M_2$ can be made proportional to $1/R_{onP1,P2}$, the startup condition for a ring-based VCO becomes independent of process corner, temperature, and supply voltage variations.

Figure 6:
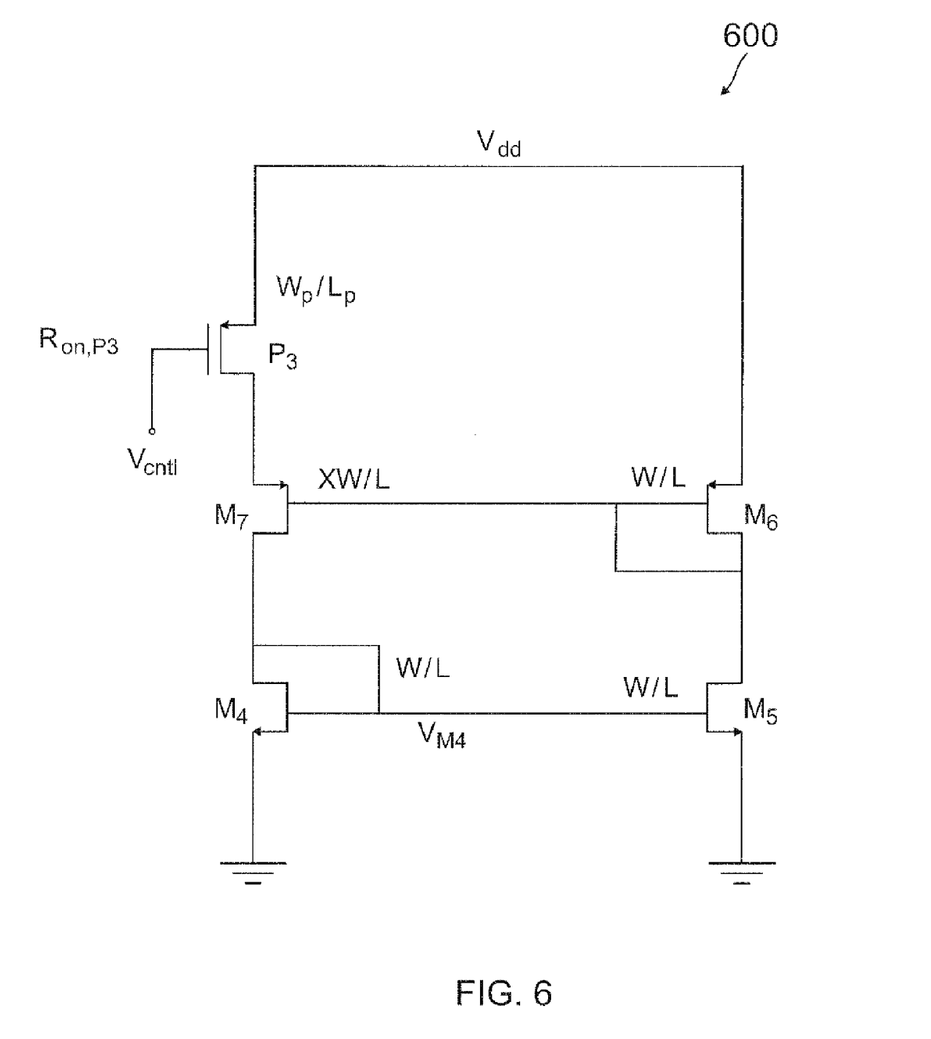
FIG. 6 is a schematic illustration of a biasing circuit.

FIG. 6 shows a biasing circuit 600 that achieves such a desirable result. PFETs $M_7$ and $M_6$ as well as NMOS transistors $M_4$ and $M_5$ are coupled together as discussed with regard to biasing circuit 300 of FIG. 3. However, the source of $M_5$ for biasing circuit 600 couples to ground instead of a parallel resistance of the inductor. The source of $M_7$ couples to the power supply voltage through a triode-mode PFET $P_3$ that is matched to PFETs $P_1$ and $P_2$ of VCO stage 500. The resistance of P3 is denoted as $R_{on,P3}$ and is given the following expression:

$$R_{on,P3} = \mu_p C_{ox}(W_p/L_p)(V_{dd}-V_{cntl})$$

where $\mu_p$ is the hole mobility, $C_{ox}$ is the oxide capacitance, $W_p$ is the transistor width, and $L_p$ is the transistor length. This resistance then controls the current through $M_7$ and thus through $M_6$ because of the current mirror relationship. It follows that the current I through M6 is given by $$I=(2/\mu_p C_{ox}(W/L)*(1/R_{on,P3})^2*(1-1/\mathrm{sqrt}(X))^2$$

The transconductance for $M_6$ is denoted as $g_{m6}$ and given by the following expression:

$$g_{m6}=\mathrm{sqrt}(2\mu_p C_{ox}(W/L)I)=(2/R_{on,P3})(1-1/\mathrm{sqrt}(X))$$

The transconductance of $M_4$ ($g_{m4}$) is related to that of $M_6$ by $$G_{m4}=\mathrm{sqrt}(\mu_n/\mu_p)g_{m6}$$

where $\mu_n$ is the electron mobility in $M_4$. Thus $g_{m4}$ is given by $$g_{m4}=\mathrm{sqrt}(\mu_n/\mu_p)(2/R_{on,P3})(1-1/\mathrm{sqrt}(X))$$

Figure 7:
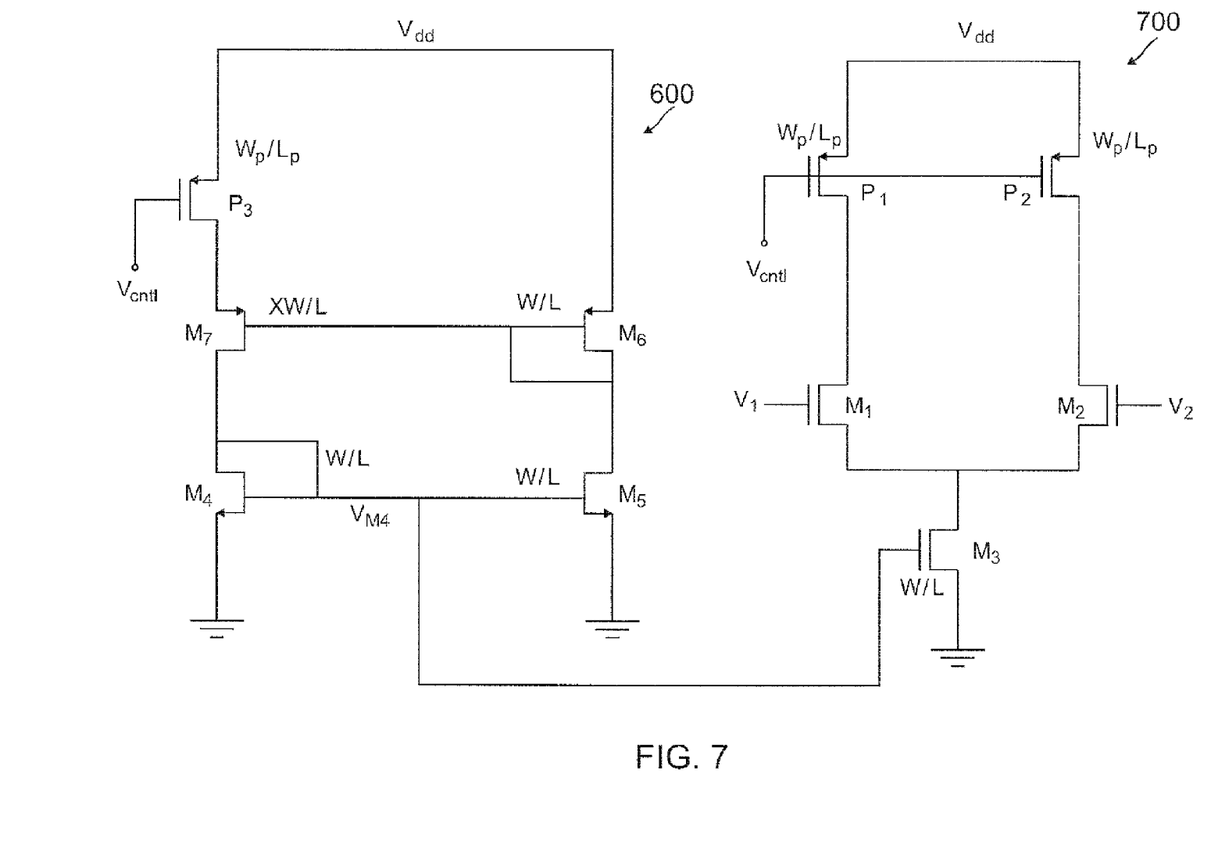
FIG. 7 is a schematic illustration of a ring-based VCO inverter stage including the biasing circuit of FIG. 6.

This transconductance setting can be exploited as shown for VCO stage 700 of FIG. 7. Rather than use a bandgap reference voltage to bias current source transistor $M_3$ as is conventional, the gate voltage $V_{M4}$ from $M_4$ in biasing circuit 600 drives the gate of $M_3$. This is quite advantageous in that the $M_3$ is matched to $M_4$ such that the transconductance for $M_3$ ($g_{m3}$) is equal to $g_{m4}$. As discussed with regard to the LC tank VCO, the transconductance for the differential pair of transistors $M_1$ and $M_2$ (denoted as $g_{m1,2}$) equals $g_{m3}$ times a proportionality constant A. It follows that the startup condition for a ring-based VCO utilizing a plurality of stages 700 becomes $$g_{m1,2} R_{onP1,P2} = 2A\, \mathrm{sqrt}(\mu_n/\mu_p)(R_{onP1,P2}/R_{on,P3})(1-1/\mathrm{sqrt}(X)) \geq 1$$

If P1, P2, and P3 are all matched, then $R_{onP1,P2}$ equals $R_{on,P3}$. The startup condition thus becomes $$g_{m1,2} R_{onP1,P2} = 2A\, \mathrm{sqrt}(\mu_n/\mu_p)(1-1/\mathrm{sqrt}(X)) \geq 1$$

Figure 8:
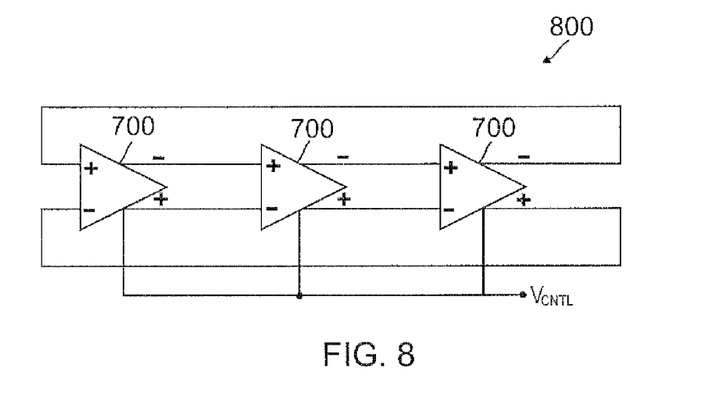
FIG. 8 is a block diagram of a ring-based VCO formed using a plurality of stages as shown in FIG. 7.

This shows that the startup condition depends only on the ratio of device widths and the ratio of the device mobilities. Because such ratios are independent of process corner, temperature, and power supply noise, so is the startup condition. A resulting ring-based VCO 800 that incorporates stage 700 is shown in FIG. 8. Biasing circuit 600 need not be duplicated for each stage such that a single biasing circuit can bias all the inverter stages.

Figure 9:
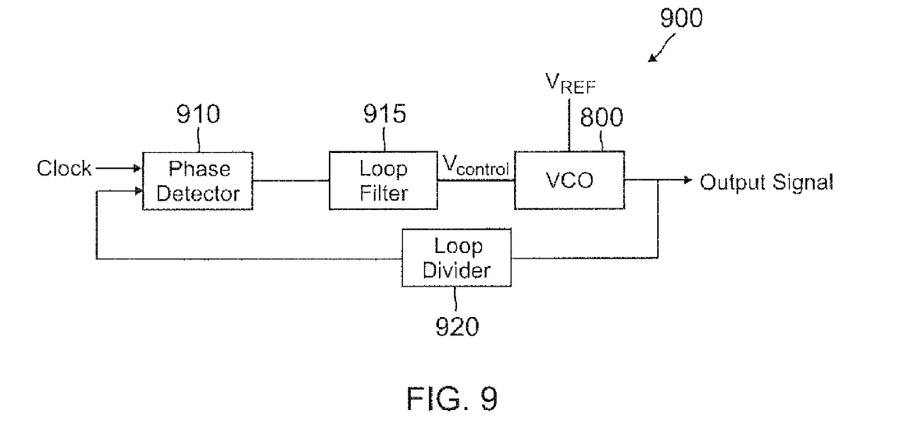
FIG. 9 is a block diagram of a phase-locked loop incorporating a ring-based VCO or a LC tank VCO as disclosed herein.

Regardless of whether an LC tank or a ring-based VCO is constructed as discussed herein, the resulting VCO may be advantageously incorporated into many circuits. The self-compensating oscillation and startup properties of VCO 800 have many applications. For example, VCO 800 (or 300) may be incorporated into a phase-locked loop (PLL) 900 as shown in FIG. 9 that includes a phase detector 910, a loop filter 915, and a loop divider 920. VCO 800 responds to the control voltage $V_{control}$ as discussed above to control its output frequency. Advantageously, this output signal frequency will not depend on the particular semiconductor process corner used to manufacture the integrated circuit forming VCO 800. Moreover, the startup conditions will not depend on operating temperature changes or process variations.

It will be appreciated that the techniques and concepts discussed herein are not limited to the specific disclosed embodiments but instead may be changed or modified. The appended claims encompass all such changes and modifications as fall within the true spirit and scope of this invention.

I claim:

1. An LC tank voltage controlled oscillator (VCO) having an output signal having a frequency responsive to a tuning signal, comprising:
    a first inductor and a second inductor coupled directly to a power supply node, each inductor having a parallel equivalent resistance;
    a differential pair of transistors configured to steer a tail current from a current source transistor, a first transistor in the differential pair coupled to the power supply node through the first inductor and a second transistor in the differential pair coupled to the power supply node through the second inductor; and
    a biasing circuit comprising a resistor coupled between the power supply node and ground, the resistor having a resistance equal to the parallel equivalent resistance, the biasing circuit configured to generate a bias voltage for the current source transistor such that a transconductance for the first and second transistors is proportional to the inverse of the parallel equivalent resistance.

2. The LC tank VCO of claim 1, wherein the biasing circuit includes a first PMOS transistor and a second PMOS transistor in a current mirror configuration.

3. The LC tank VCO of claim 2, wherein the biasing circuit further includes a first NMOS transistor, and wherein a drain of the first PMOS transistor couples to a drain and a gate of the first NMOS transistor.

4. The LC tank VCO of claim 3, wherein the biasing circuit further includes a second NMOS transistor having a drain coupled to a drain of the second PMOS transistor and having a source coupled to ground through the resistor having a resistance equal to the parallel equivalent resistance.

5. The LC tank VCO of claim 2, wherein a gate of the first PMOS transistor is coupled to a gate and a drain of the second PMOS transistor.

6. The LC tank VCO of claim 4, wherein a width-to-length ratio of the second NMOS transistor is a factor X times larger than a width-to-length ratio of the first NMOS transistor, wherein X is a number larger than one.

7. The LC tank VCO of claim 6, wherein X is greater than or equal to ten.

8. The LC tank VCO of claim 1 incorporated into a phase locked loop (PLL).

* * * * *